US006678055B2

(12) United States Patent
Du-Nour et al.

(10) Patent No.: US 6,678,055 B2
(45) Date of Patent: Jan. 13, 2004

(54) METHOD AND APPARATUS FOR MEASURING STRESS IN SEMICONDUCTOR WAFERS

(75) Inventors: Ofer Du-Nour, Timrat (IL); Yaron Ish-Shalom, Kiryat Tivon (IL)

(73) Assignee: Tevet Process Control Technologies Ltd., Moshava Yokneam (IL)

( * ) Notice: Subject to any disclaimer, the term of this patent is extended or adjusted under 35 U.S.C. 154(b) by 38 days.

(21) Appl. No.: 09/991,709

(22) Filed: Nov. 26, 2001

(65) Prior Publication Data
US 2003/0098704 A1 May 29, 2003

(51) Int. Cl.[7] .............................................. G01B 9/02
(52) U.S. Cl. ...................................... 356/504; 356/35.5
(58) Field of Search ........................... 356/35.5, 72, 73, 356/485, 492, 496, 451, 503, 504, 508, 509, 510, 511, 516, 517

(56) References Cited

U.S. PATENT DOCUMENTS 4,844,616 A * 7/1989 Kulkarni et al. ............ 356/495
5,900,633 A * 5/1999 Solomon et al. ........ 250/339.08
6,278,809 B1 * 8/2001 Johnson et al. ................ 385/12

* cited by examiner

Primary Examiner—Samuel A. Turner
Assistant Examiner—Michael A. Lyons
(74) Attorney, Agent, or Firm—G. E. Ehrlich (1995) Ltd.

(57) ABSTRACT

Integrated measurement apparatus and method for measuring layer thickness and bow in a wafer. The apparatus comprises: a monochromatic light source, a white light source, a first switch for switching between the white light source and the monochromatic light source, a plurality of optical heads for directing light from the switched light source onto different locations on a semiconductor wafer surface, a first optical processor for spectral processing of reflected light from the wafer, a second optical processor for processing of reflected light to determine an extent of bow in the wafer, and a second optical switch to switch reflected light from the wafer between the first optical processor and the second optical processor so that the white light is spectrally processed to determine layer thicknesses and the monochromatic light is processed for bowing.

51 Claims, 10 Drawing Sheets

METHOD AND APPARATUS FOR MEASURING STRESS IN SEMICONDUCTOR WAFERS

FIELD OF THE INVENTION

The present invention relates to a method and apparatus for measuring stress in semiconductor wafers, and more particularly but not exclusively to measuring stress in an integrated operation or apparatus together with thickness, in semiconductor wafers.

BACKGROUND OF THE INVENTION

The semiconductor chip manufacturing process generally involves forming a silicon wafer and then carrying out a sequence of operations that essentially involves addition and selective removal of layers to build the functionality of the chip.

Layer thickness and layer stress are two measurements that are carried out on the silicon wafers at various stages of the manufacturing process. In particular, in the semiconductor manufacturing process, there are several steps in which dielectric layers are deposited on the silicon wafers as part of the above-mentioned sequence.

Following deposition, several properties of the layer may then be tested to verify both the quality of the layer itself and the quality of the deposition process. In general, thickness and stress are measured separately and in different ways. The two measurements increase the time of the process, thereby reducing throughput, and also increase the floor space required to accommodate the process.

Concerning thickness measurement, PCT Patent Application No. WO 0012958 describes a measurement system, known as TMS, which uses light beams reflected from points within layers of a wafer surface to make measurements of the thicknesses of transparent layers and in particular photoresist layers. The measurement is transformed typically into the frequency domain from which it is possible to determine the photoresist layer thickness very accurately. The measurement is rapid and simple.

Moving on to stress measurement, when a thin film is deposited onto a substrate such as a semiconductor wafer, mechanical stress is built up on both the film and the substrate. The stress may cause the wafer to bow as well as induce cracks, voids, hillock formation and film lifting, leading to reduced yield and lowered reliability.

A known method of measuring stress levels that develop when a thin film is deposited onto a substrate such as a semiconductor wafer, involves measuring the bow of the wafer as a whole prior to deposition of the layer, storing the result, and then measuring it again following deposition of the layer.

Determining the bow may be carried out using a laser, or more generally a monochromatic light beam, reflected from the wafer for measurement of net radius of curvature R. A stress level may be determined by the known formula:

$$\text{Stress} = \frac{E D s^2}{6(1-v) D f R},$$

Where
  E=Young's modulus of the substrate,
  v=Poisson's ratio for the substrate,
  Ds=thickness of the substrate,
  R=net radius of curvature,
  Df=thickness of film.

Incompatibility of the light sources, and also the need to carry out the first part of the stress measurement prior to deposition of the layer precludes integrating the thickness and stress measurements. Generally the two measurements are carried out separately in time and using separate measuring devices.

SUMMARY OF THE INVENTION

According to a first aspect of the present invention there is thus provided apparatus for measuring properties of a wafer, the apparatus comprising:
  at least one monochromatic light source, for producing monochromatic light for directing at the wafer,
  at least a first and a second beam director, each optically associated with the monochromatic light source for directing the monochromatic light beams as respective substantially parallel light beams towards the wafer, each to strike at respective places on a planar surface of the wafer, the first beam director being arranged to direct a respective beam substantially centrally onto the planar surface and the second beam director being arranged to direct a respective beam substantially outwardly of the center, and
  an optical processor arranged to receive reflections of each beam and to process each reflection, therefrom to obtain an optical difference between the reflections, the optical difference being indicative of bow in the wafer, The apparatus preferably comprises a measurement mode switch for switching between the bow measurement and measurement of another property of the wafer.

The apparatus preferably comprises an output operatively associated with the optical processor for outputting an indication of stress in the wafer, the indication being based on the bow.

The beam directors preferably comprise optical heads for receiving light from the monochromatic light source and directing the light as beams to the wafer.

The optical heads are preferably operable to receive the reflections from the wafer and to direct the reflections to the optical processor.

Preferably, the first beam director is arranged to direct light to strike the planar surface substantially perpendicularly.

Preferably, at least the second beam director is arranged to direct light to strike the planar surface substantially obliquely.

Preferably, the optical processor comprises an interferometer.

Preferably, the interferometer is operable to produce an interference pattern between the beams, the optical difference being a path difference between the beams.

Preferably, the interferometer is a Michelson interferometer.

Preferably, the optical processor comprises a beam reflector and a plurality of waveguides, the beam reflector being arranged to deflect reflections from the planar surface to the waveguides such that intensity of the deflection is differentially distributed between the waveguides as a function of an angle of the reflection.

Preferably, the optical processor further comprises an intensity measurer for measuring light intensity in each of the waveguides, the optical difference being a difference in distribution of intensity over the waveguides.

Preferably, the optical beam reflector is an off axis parabolic reflector.

Preferably, the monochromatic light source comprises a laser.

The apparatus preferably comprises a stress determination unit operable to determine a stress level from the bow using the relationship $$\text{stress} = \frac{ED^2}{6(1-v)tR},$$

wherein
E=Young's modulus of the wafer,
v=Poisson's ratio for the wafer,
$D_s$=thickness of the wafer,
R=net radius of curvature, derivable from the bow, and
$D_f$=thickness of a film deposited on the wafer.

Preferably, another property is thickness, the apparatus further comprising a white light source, each the beam director comprising a first optical switch to select between the white light source and the monochromatic source.

The apparatus preferably comprises a second optical processor and at least one second optical switch, the second optical switch being arranged to select between the first optical processor and the second optical processor to direct the reflections to the selected optical processor.

Preferably, the second optical processor comprises a spectrometer.

Preferably, the first and second optical switches are controllable together to select the monochromatic light source with the first optical processor and the white light source with the second optical processor.

The apparatus preferably comprises a Fourier transform device connected to the spectrometer for transforming an output of the spectrometer into the frequency domain, thereby to obtain information of layer thickness of at least one deposited layer on the wafer.

According to a second aspect of the present invention there is provided an integrated measurement apparatus for measuring layer thickness and bow in a wafer, the apparatus comprising:
a monochromatic light source,
a white light source,
a first switch for switching between the white light source and the monochromatic light source,
a plurality of beam directors for directing light from the switched light source onto a semiconductor wafer,
a first optical processor for spectral processing of reflected light from the wafer,
a second optical processor for processing of reflected light to determine an extent of bow in the wafer, and
a second optical switch to switch reflected light from the wafer between the first optical processor and the second optical processor.

Preferably, the first optical processor is a spectrometer and the second optical processor is an interferometer.

Preferably, the first optical processor is a spectrometer and the second optical processor comprises
a reflector, for deflecting reflected light from the wafer,
a series of waveguides arranged to intercept the deflected light, in such a way that different angles of reflection of the light from the wafer are indicated by different waveguides respectively giving maximum light intensity,
light intensity detectors associated with each waveguide to detect light intensity at each waveguide, thereby to determine which waveguide has a maximum intensity, and therefrom to derive the angle of reflection from the wafer.

The apparatus preferably comprises a stress calculator operatively associated with the second optical processor for calculating an indication of stress in the wafer, the indication being based on the bow.

Preferably, the light directors comprise optical heads operable to receive the reflections from the wafer and to direct the reflections to the second optical switch.

Preferably, the interferometer is a Michelson interferometer.

Preferably, the optical beam reflector is a parabolic reflector.

Preferably, the monochromatic light source comprises a laser.

The apparatus preferably comprises a stress determination unit operable to determine a stress level from the bow using the relationship $$\text{stress} = \frac{ED^2}{6(1-v)tR},$$

wherein
E=Young's modulus of the wafer,
v=Poisson's ratio for the wafer,
$D_s$=thickness of the wafer,
R=net radius of curvature, derivable from the bow, and
$D_f$=thickness of a film deposited on the wafer.

The apparatus preferably comprises a Fourier transform device connected to the spectrometer for transforming an output of the spectrometer into the frequency domain, thereby to obtain information of layer thickness of at least one deposited layer on the wafer.

According to a third aspect of the present invention there is provided a method of measuring stress in a silicon wafer, using an integrated measurement apparatus, the method comprising:
switching in a monochromatic light source to produce at least two monochromatic light beams,
reflecting the at least two beams of light from a surface of a wafer, a first beam from a central region of the wafer and a second beam from a peripheral region of the wafer,
determining properties of the reflected beams,
comparing the determined properties of the reflected light beams to thereby determine an extent of bowing in the wafer, and
calculating a stress level in the wafer from the extent of bowing.

Preferably, the properties are path lengths of the reflected beams.

Preferably, the determination and comparison comprise:
setting up an interference pattern between the reflections, and
analyzing the interference pattern.

Preferably, the determination and comparison comprise measuring and comparing respective angles of reflection of the beams.

Preferably, the method further comprises determining the stress level from the extent of bowing using the relationship $$\text{stress} = \frac{ED^2}{6(1-v)tR},$$

wherein
E=Young's modulus of the wafer, v=Poisson's ratio for the wafer,
$D_s$=thickness of the wafer,
R=net radius of curvature, derivable from the bow, and
t=thickness of a film deposited on the wafer.

Preferably, the light beams are laser light beams.

Preferably, the monochromatic light source is a laser light source.

Preferably, the method further comprises carrying out the determination and comparison using a Michelson interferometer.

According to a fourth aspect of the present invention there is provided a method of integrated measurement of stress and thickness in a semiconductor wafer, the method comprising:

selecting between a white light source and a monochromatic light source,
with the white light source:
irradiating a semiconductor at a single point,
receiving reflected light from the single point,
spectrally analyzing the reflected light using a transform,
deriving layer thickness from the analysis,
with the monochromatic source:
reflecting at least two beams of light from a surface of a wafer, a first beam from a central region of the wafer and a second beam from a peripheral region of the wafer,
determining properties of the reflected beams,
comparing the determined properties of the reflected light beams to thereby determine an extent of bowing in the wafer, and
calculating a stress level in the wafer from the extent of bowing.

Preferably, the properties are path lengths of the reflected beams.

Preferably, the determination and comparison comprise:
setting up an interference pattern between the reflections, and
analyzing the interference pattern.

Preferably, the determination and comparison comprise measuring and comparing respective angles of reflection of the beams.

Preferably, the method further comprises determining the stress level from the extent of bowing using the relationship $$\text{stress} = \frac{ED^2}{6(1-v)tR},$$

wherein
E=Young's modulus of the wafer,
v=Poisson's ratio for the wafer,
$D_s$=thickness of the wafer,
R=net radius of curvature, derivable from the bow, and
t=thickness of a film deposited on the wafer.

Preferably, the method further comprises obtaining the monochromatic light beams from a laser light source.

Preferably, the method further comprises carrying out the determination and comparison using a Michelson interferometer.

Preferably, the method further comprises optically switching between the white and the monochromatic light sources.

Preferably, the method further comprises optically switching between a spectrometer and an interferometer.

Preferably, the method further comprises controlling the optical switching so that the spectrometer is selected with the white light source and the interferometer is selected with the monochromatic light source.

Preferably, the method further comprises switching light from either light source to an integrated beam former arrangement for irradiating the wafer.

Preferably, the integrated beam forming arrangement comprises a plurality of optical heads also usable to receive reflections from the wafer.

BRIEF DESCRIPTION OF THE DRAWINGS

For a better understanding of the invention and to show how the same may be carried into effect, reference will now be made, purely by way of example, to the accompanying drawings, in which.

DESCRIPTION OF THE PREFERRED EMBODIMENTS

As an introduction to the present invention, the measurement method of PCT Patent Application No. WO 0012958 is discussed in detail.

Figure 1A:
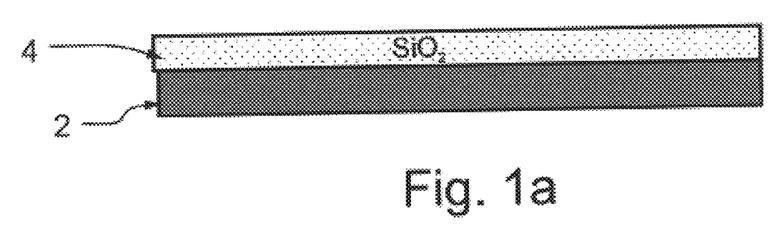
FIG. 1A is a simplified diagram of a layered wafer product.

Reference is now made to FIG. 1A, which is a simplified diagram showing a cross section of a silicon wafer at an intermediate stage in the production process. A silicon wafer 2 has a SiO2 layer 4 attached thereon. In FIG. 1A the SiO2 layer 4 is uniform and only a single measurement is necessary to determine the thickness of the layer.

Figure 1B:
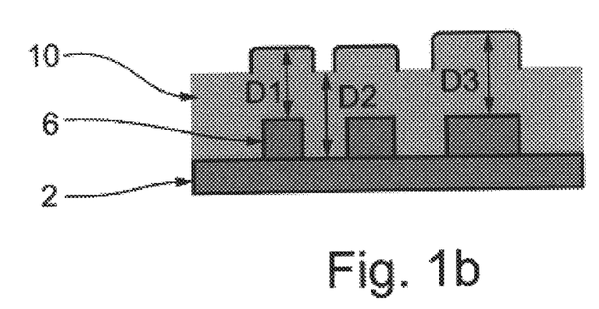
FIG. 1B is a simplified diagram of the layered wafer product of FIG. 1 at a later stage in the production process.

Reference is now made to FIG. 1B, which is a simplified diagram showing a cross section of another silicon wafer at another intermediate stage in the production process. In FIG. 1B the wafer 2 comprises a series of metal structure 6, and a continuous SiO2 layer 10. The TMS measurement system, as will be explained in more detail below, is particularly suitable for measuring the thickness of a transparent film. In the present case the SiO2 layer 10 has differences in thickness at different places due to the metal structures 6. There may thus be identified three different layer thickness $d_1$–$d_3$ in a typical wafer. These above differences in thickness are not accurately measurable in a conventional measurement system. The TMS system however, is capable of measuring such thickness variations in wafer layers that are applied or layers that have been removed, and furthermore the measurement is in situ and in real-time. The following description of the basic theory of operation of the TMS process will be helpful in understanding how this may be achieved.

Figure 2:
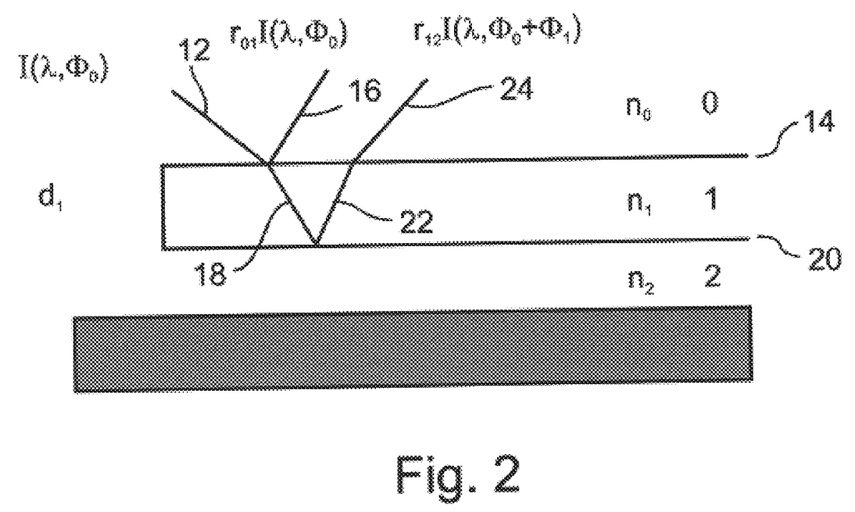
FIG. 2 is a simplified ray diagram illustrating how light reflection can be used to obtain information of layer thicknesses in a layered wafer product.

Reference is now made to FIG. 2, which is a simplified ray diagram showing incidence of light at an angle onto a series of layers having different refractive indices.

In FIG. 2, a material comprising three transparent layers, 0, 1, and 2, are subjected to light radiation. An incident ray 12 strikes a first layer boundary 14 to be split into a reflected ray 16 and a refracted ray 18. The refracted ray 18 strikes a second layer boundary 20 and is again split. This time only the reflected ray 22 is shown. As the refracted ray 22 strikes the first boundary 14 it is refracted again to comprise a third refracted ray 24.

Several methods are known for measuring thickness of transparent films using the reflected pattern of multi-wavelength light. When the beam shown in FIG. 2 is a monochromatic (single wavelength) light beam, and it arrives at a transparent film, part of the beam is reflected from the upper face (Layer 0/Layer 1 interface), and part is reflected from the bottom face (Layer 1/Layer 2 interface).

Expressing mathematically what is shown in FIG. 2:

$\lambda$ is the wavelength of the light;

$\phi_o$ is the phase angle of the incident light (and of the light reflected from the Layer 0/Layer 1 interface);

$\phi_o + \phi_1$ is the phase angle of the light reflected from the Layer 1/Layer 2 interface;

$r_{01}$ is the reflection coefficient of the Layer 0/Layer 1 interface;

$r_{12}$ is the reflection coefficient of the Layer 1/Layer 2 interfaces; and

I is the intensity of the incident light $$I = I_0 \cos(2\pi ct/\lambda + \phi_o) \quad \text{(EQ.1)}$$

Where $I_0$ is the maximum intensity amplitude and c is the speed of light.

For light arriving perpendicularly at the film surface, the reflection coefficients from the top and bottom surfaces are:

$$r_{01} = (n_1 - n_0)/(n_1 + n_0) \quad r_{12} = (n_2 - n_1)/(n_2 + n_1) \quad \text{(EQ. 2)}$$

wherein $n_0$, $n_1$, $n_2$ are the refractive indices of layers 0, 1 and 2, respectively.

The light reflected from the upper face interferes with the light reflected from the bottom face, giving an overall reflection coefficient R which is a function of the layer thickness, the light wavelength and the layer refractive index. This reflection can be described by the, well-known, Frenel equation.

$$R = (r_{01}^2 + r_{12}^2 + 2r_{01}r_{12}\cos 2\Phi_1)/(1 + r_{01}^2 r_{12}^2 + 2r_{01}r_{12}\cos 2\Phi_1) \quad \text{(EQ. 3)}$$

where:

$$\Phi_1 = 2\pi n_1 d_1/\lambda \quad \text{(EQ. 4)}$$

where:

$d_1$—layer thickness.

Illuminating the film with multi-wavelength light (white light), and measuring the reflectance at each wavelength ($\lambda$), gives R as a function of $\lambda$, i.e., R($\lambda$).

Illuminating a product wafer having a complex (i.e. laterally varying) topography with a large spot of multi-wavelength light causes a reflected beam which is a composition of the separate reflection of each of the thicknesses taken alone.

$$R(\lambda, d_1, \ldots d_n) = \Sigma_i (r_{(I-1),i}^2 + r_{i(I+1)}^2 + 2r_{(I-1),i}r_{i(I+1)}\cos 2\Phi_1/(1 + r_{(I-1),i}^2 r_{i(I+1)}^2 + 2_{(I-1),i}r_{i(I+1)}\cos 2\Phi_1) \quad \text{(EQ. 5)}$$

By simple mathematical operations it is possible to express the reflection coefficient by:

$$R(1, d_1, \ldots d_n) = \Sigma_i [1 - A/(1 + B \cos(2\Phi_i))] \quad \text{(EQ. 6)}$$

where:

$A_i = (1 - r_{I-1,i}^2)(1 - r_{(I+1)}^2)/(1 + r_{(I-1),i}^2 r_{i(I+1)}^2)$ and
$B_i = 2r_{(I-1),i} r_{i(I+1)}/(1 + r_{(I-1),i}^2 r_{i(I+1)}^2)$ Applying ways of frequency decomposition of the reflection coefficient may provide each of the arguments ($\Phi_i$) and from Eq 3 & 4 it is possible to determine the layer thickness assuming that the layer refractive index is known. Alternatively it is possible to determine the layer refractive index, if the layer thickness is known.

There are several ways to perform frequency decomposition, some of which are suggested below:

Mathematical Decompositions

1) The family of orthogonal transform methods, for example Fourier transforms,
2) The family of methods based on the maximum likelihood principle,
3) The family of methods based on parametric models
4) The family of subspace decomposition methods.

Electrical Decomposition:

Electrical frequency filters are widely used in electrical systems. Such filters serve to define windows in the frequency domain and output the amplitude of the component of the input signal within the range of the window. Passing the reflected signal (translated into electrical signal) through a set of filters or a single filter with variable frequency gives the desired decomposition.

Figure 3:
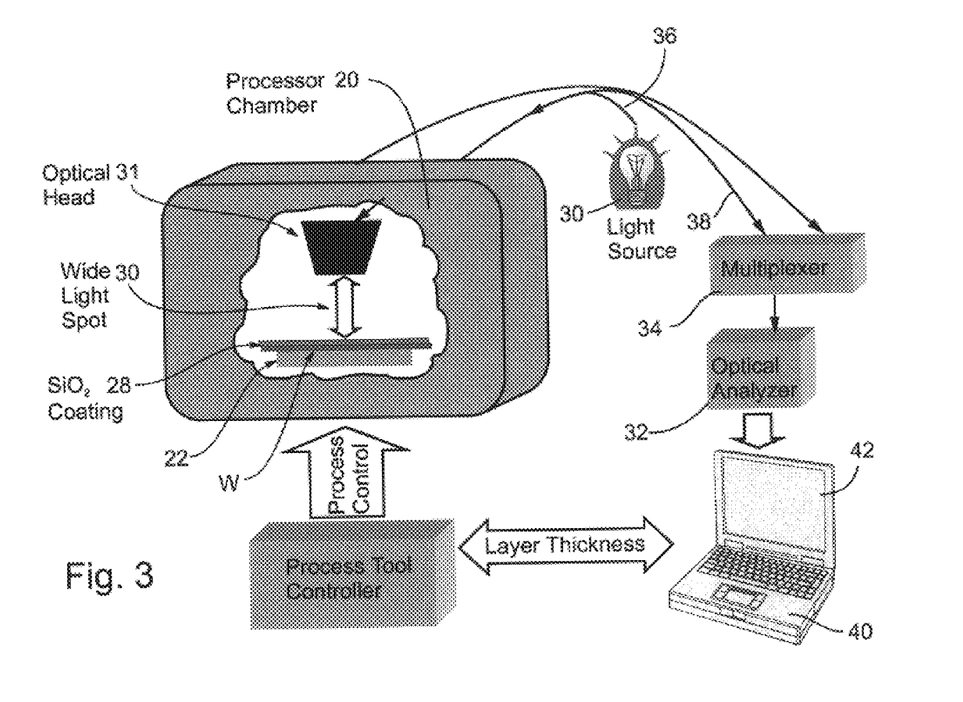
FIG. 3 is a simplified schematic diagram of a reflection-based measuring device associated with a Chemical Vapor deposition (CVD) tool in a semiconductor wafer production line.

Reference is now made to FIG. 3, which is a simplified block diagram showing an arrangement for measuring the thickness variations of a transparent layer on a semiconductor substrate. The measurement arrangement is mounted on a chemical vapor deposition (CVD) tool. The deposition chamber 20 comprises a chuck 22 for receiving a wafer W, and a controller 24 for controlling the deposition parameters to deposit an SiO2 layer 28 using chemical reactions.

As illustrated in FIG. 3, the apparatus further includes an illuminating device 30 for illuminating the photoresist coating with a beam of light of multiple wavelengths (white light), and a detector 32 for detecting the intensity of the light reflected from the SiO2 for each wavelength. Preferably, the detector 32 is connected to a photodiode array spectrum analyzer. The spectrum analyzer is able to detect interference patterns over a range of wavelengths and, using the equations as given above, is able to obtain data of the layer thickness.

In order to obtain information on the thickness or refractive index of more then one spot on the wafer, multiple detecting heads 31 may be placed at different locations above the wafers. The outputs of the detecting heads 31 are preferably multiplexed for sending to the spectrum analyzer 32, for example by mechanically switching between each of the optical fibers. Data acquisition is thus enabled from different sites on the wafer.

The illuminating device preferably applies a beam of white light in any suitable manner, e.g., via an optical fiber 36, to an optical head 31 mounted above the wafer W, thereby projecting a beam of light onto the SiO2 coating of the wafer W as the wafer is rotated. The light reflected from the photoresist coating is directed in any suitable manner, e.g., via another optical fiber 38, to the spectrum analyzer 34, thereby to detect the intensity of the light reflected from the SiO2 for each wavelength.

The outputs of the spectrum analyzer 34 are preferably fed to a processor 40 which processes the outputs according to the basic theory of operation described above, and displays the outputs on a screen 42. In addition, an output of processor 40 may also be used, for example as a feedback input, for controlling the application of the SiO2 layer 28 onto the wafer W.

Preferably, the beam of light 30 is large enough to cover at least one complete die of a plurality of dies carried by the wafer W. The use of such a beam of light large enough to cover a complete die, or a multiple thereof, provides a number of advantages. For example it better ensures that the combined reflected light detected by detector 32 will not change substantially between measurements, irrespective of the difference in the exact measurement position. Furthermore, the large spot size increases the signal collected by the optical head and also increases the speed of detection.

Figure 4:
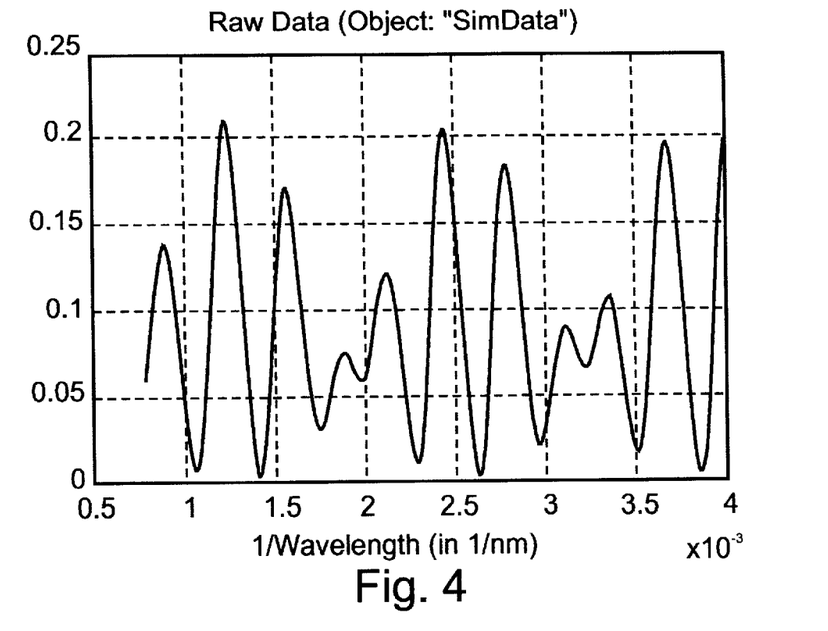
FIG. 4 is a typical graph of wavelength against intensity obtained by measuring a semiconductor wafer coated with Photoresist.

Reference is now made to FIG. 4, which is a simplified graph illustrating wavelength against amplitude for a typical set of measurements involving a simulation of the above-described process when applied to a wafer coated with a photoresist coating having two different thicknesses ($d_1$, $d_2$) at different points, for example as the result of an etching operation. FIG. 4 thus illustrates the sum R of the reflectance coefficients $r_1$ and $r_2$ as a function of thickness $d_1$ and $d_2$ respectively and the wavelength. In the example, $d_1=0.95\mu$; $d_2=1.25\mu$, and f (the ratio of the intensity of the separated signals)=1.

Figure 5:
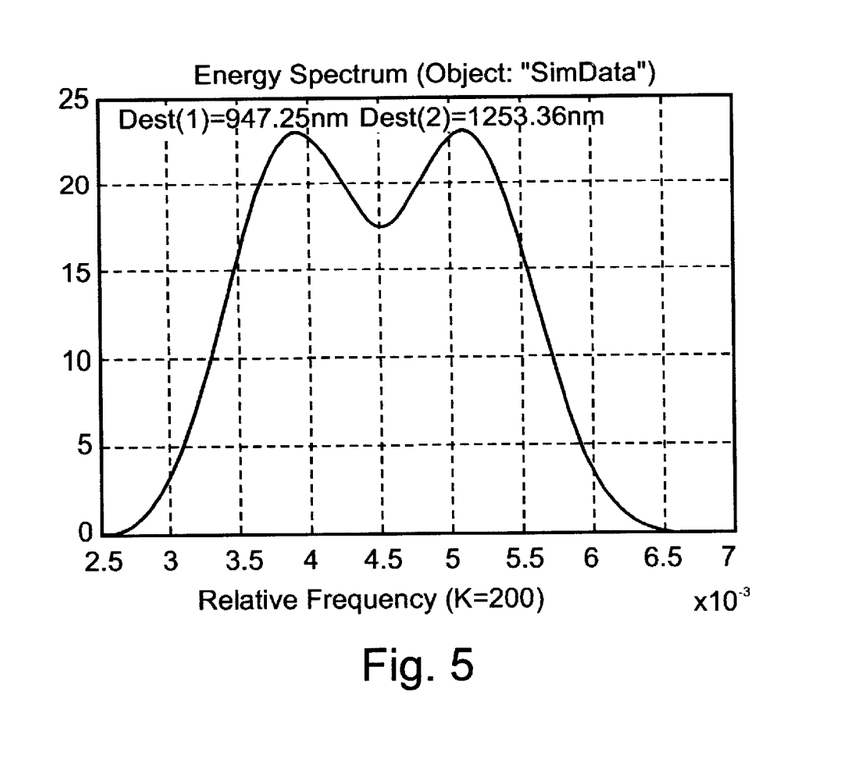
FIG. 5 is the energy or intensity spectrum obtained by performing a Fourier transform on the graph of FIG. 3.

Reference is now made to FIG. 5 which is a simplified graph showing the data of FIG. 4 to which a Fourier transform has been applied, that is to say a Fourier transform is applied to the signal R which defines the overall reflection. The Fourier transform produces a series of Fourier coefficients for the signal frequencies, from which the thickness of the transparent film can be determined for each respective signal frequency. As shown in FIG. 5, the two thicknesses of the photoresist coating produce two quite distinct peaks, each representing the frequency related to one of the thicknesses.

Figure 6:
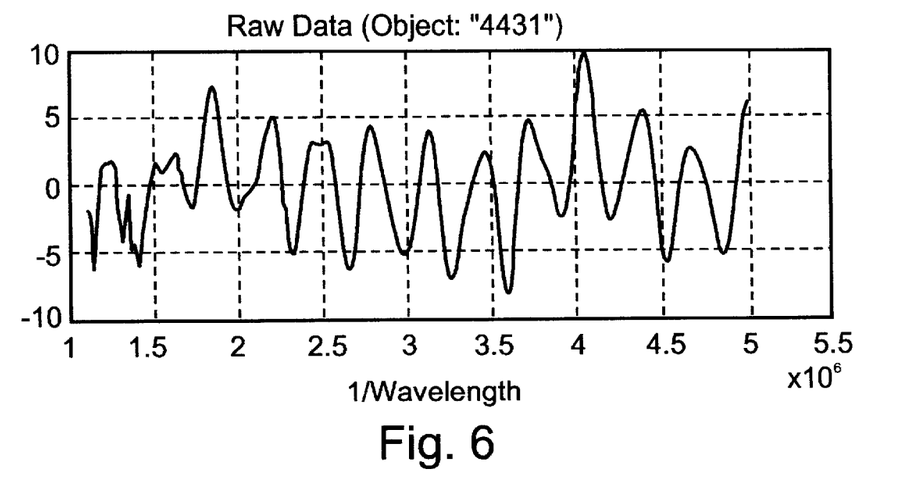
FIG. 6 is a typical graph of wavelength against intensity for another semiconductor wafer using the apparatus of FIG. 3.
Figure 7:
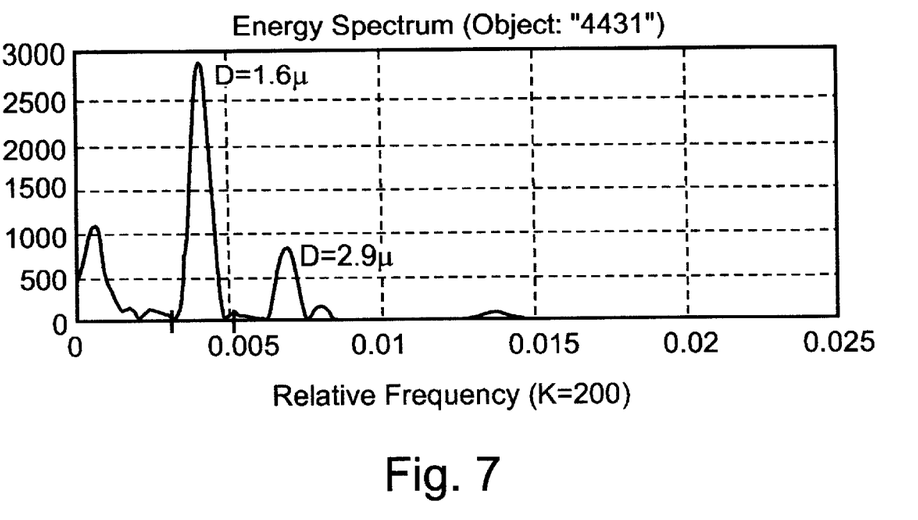
FIG. 7 is the energy or intensity spectrum obtained by performing a Fourier transform on the graph of FIG. 6.

Reference is now made to FIGS. 6 and 7, which are simplified graphs illustrating how the system described above may be used to measure thicknesses of two layers superimposed upon each other.

FIG. 6 shows intensity against wavelength for a reflection signal from a wafer with a pattern of metal lines covered by an inter-metal dielectric on Silicon dioxide (Oxide). Two thicknesses of oxide are present at the vicinity of a measurement spot:

1) oxide on top of the metal lines, with $d_2=1556$ nm, and
2) oxide on top of previously deposited dielectric of thickness of $d_1=722$ nm.

FIG. 7 illustrates the signal received after processing by a frequency transformation process similar to that mentioned above. The results show the peaks at frequencies related to $d_2$ and $d_1+d_2$.

Figure 8:
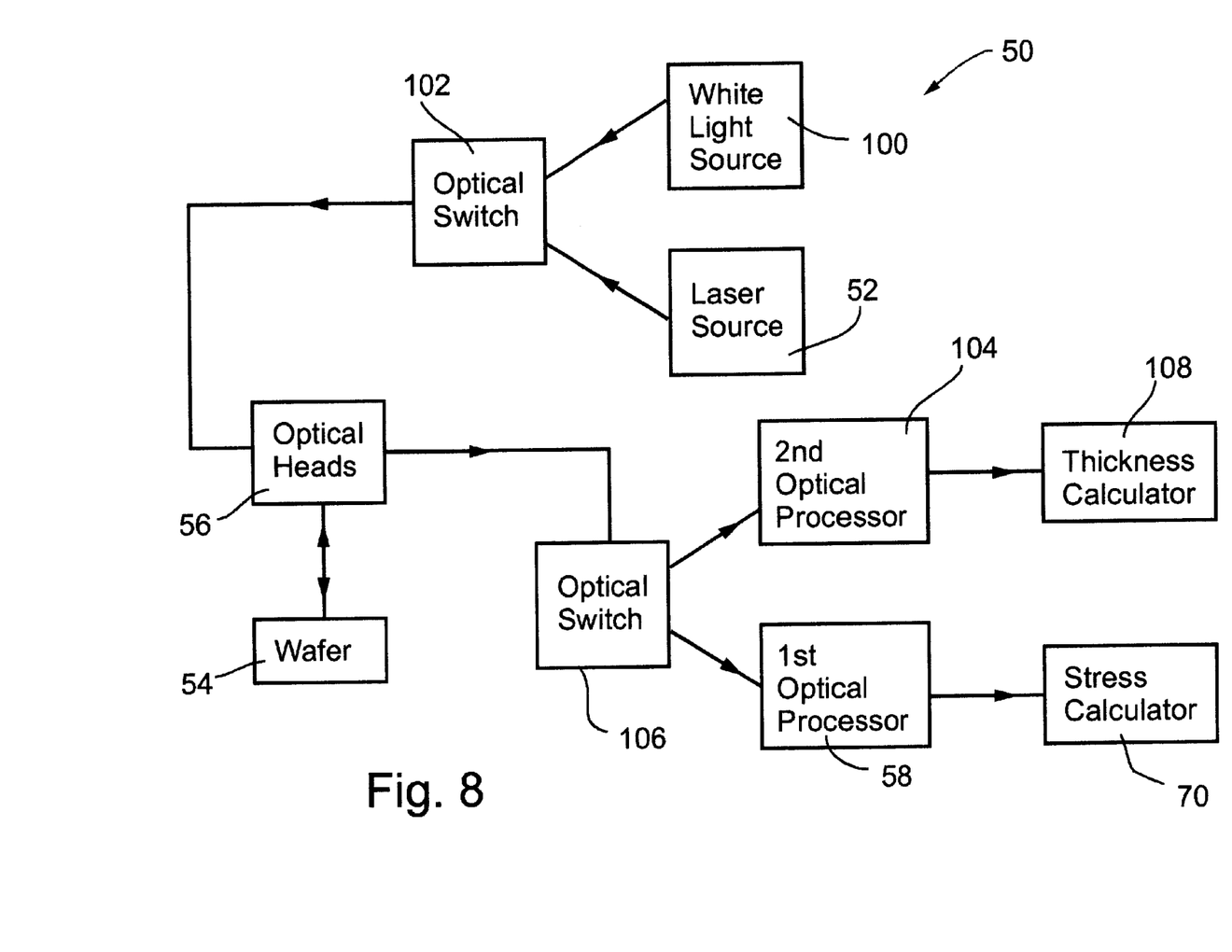
FIG. 8 is a generalized block diagram of a measurement device according to a first embodiment of the present invention.

Reference is now made to FIG. 8, which is a simplified block diagram showing an integrated measurement device according to a first embodiment of the present invention. In FIG. 8, an integrated measurement apparatus 50 comprises thickness measurement components and stress measurement components, as well as common components for both kinds of measurement and switching components.

Firstly, considering the stress measurement components, a monochromatic light source, typically a laser 52, produces monochromatic light for directing at a wafer 54. An optical head arrangement 56 comprises at least two optical heads for directing light from laser source 52 as a series of parallel beams towards different parts of the wafer 54. Preferably, one of the beams is directed towards a central region of the wafer and the second beam is directed to a peripheral edge of the wafer.

Preferably, an optical processor 58 is arranged to receive reflections of each beam to process each reflection, therefrom to obtain an optical difference between said reflections, typically a phase difference, or a difference in optical path length. The phase difference is generally indicative of bowing in the wafer 54. Alternatively, the optical difference may be a difference in reflection angle. As will be appreciated, the reflection angle is indicative of the relative angles of the wafer surface at the various points tested, and suitable analysis may allow the extent of bowing to be determined.

Figure 9:
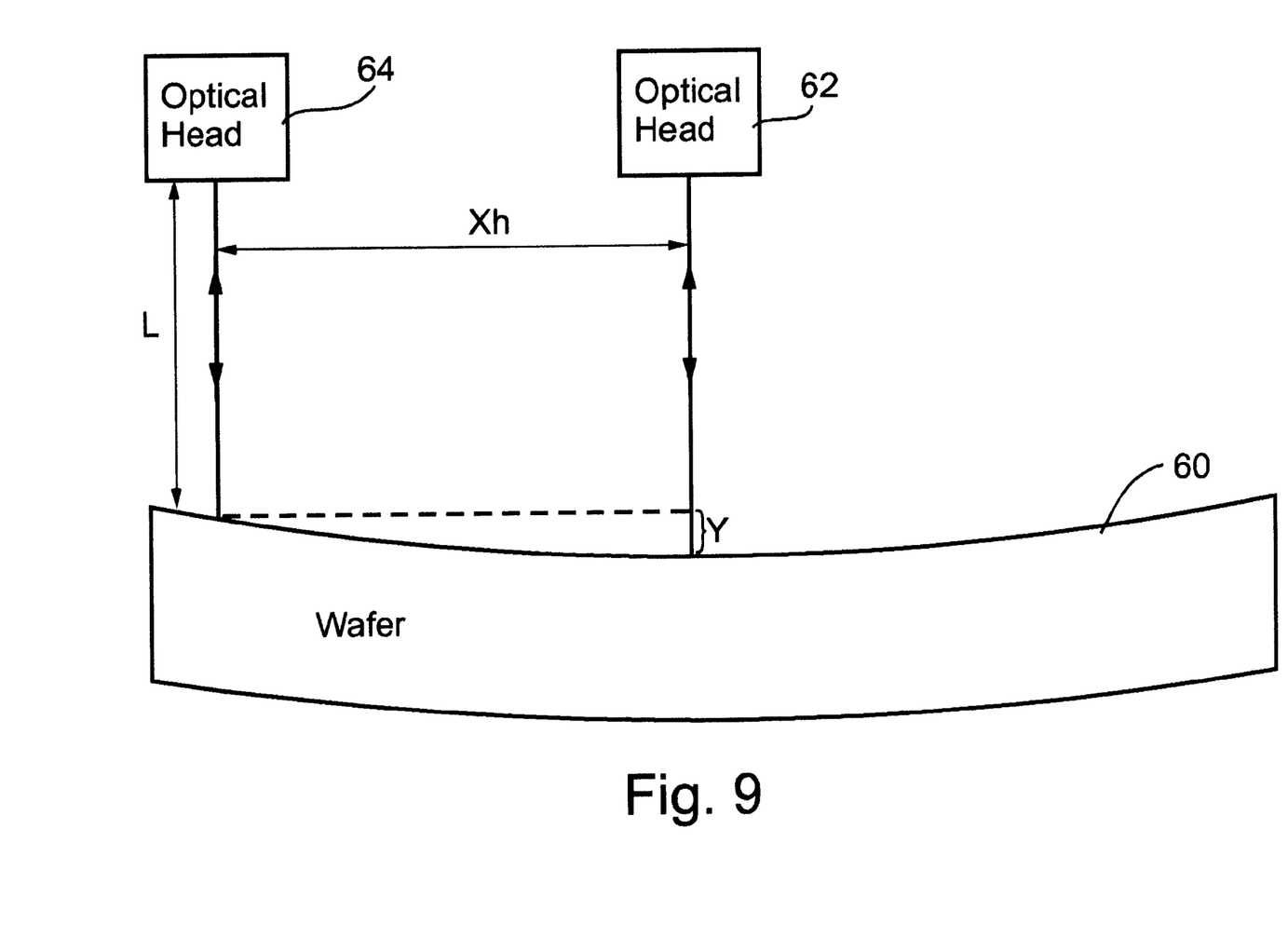
FIG. 9 is a simplified schematic diagram showing measurement of bow according to one embodiment of the present invention.

Reference is now made to FIG. 9, which is a simplified schematic diagram showing in more detail an arrangement for measuring a phase difference indicative of bow in the wafer. A wafer 60, which is bowed due to stress, is arranged underneath optical heads 62 and 64 such that optical head 62 is located substantially over a central region of the wafer and optical head 64 is substantially over a peripheral region of the wafer.

It will be appreciated that it is not essential that the optical heads are located over central and peripheral regions of the wafer, however, since the equations to be described below for determining the stress require only the radius of curvature, and the radius may be obtained simply by knowing the distance between the respective optical heads.

Figure 9A:
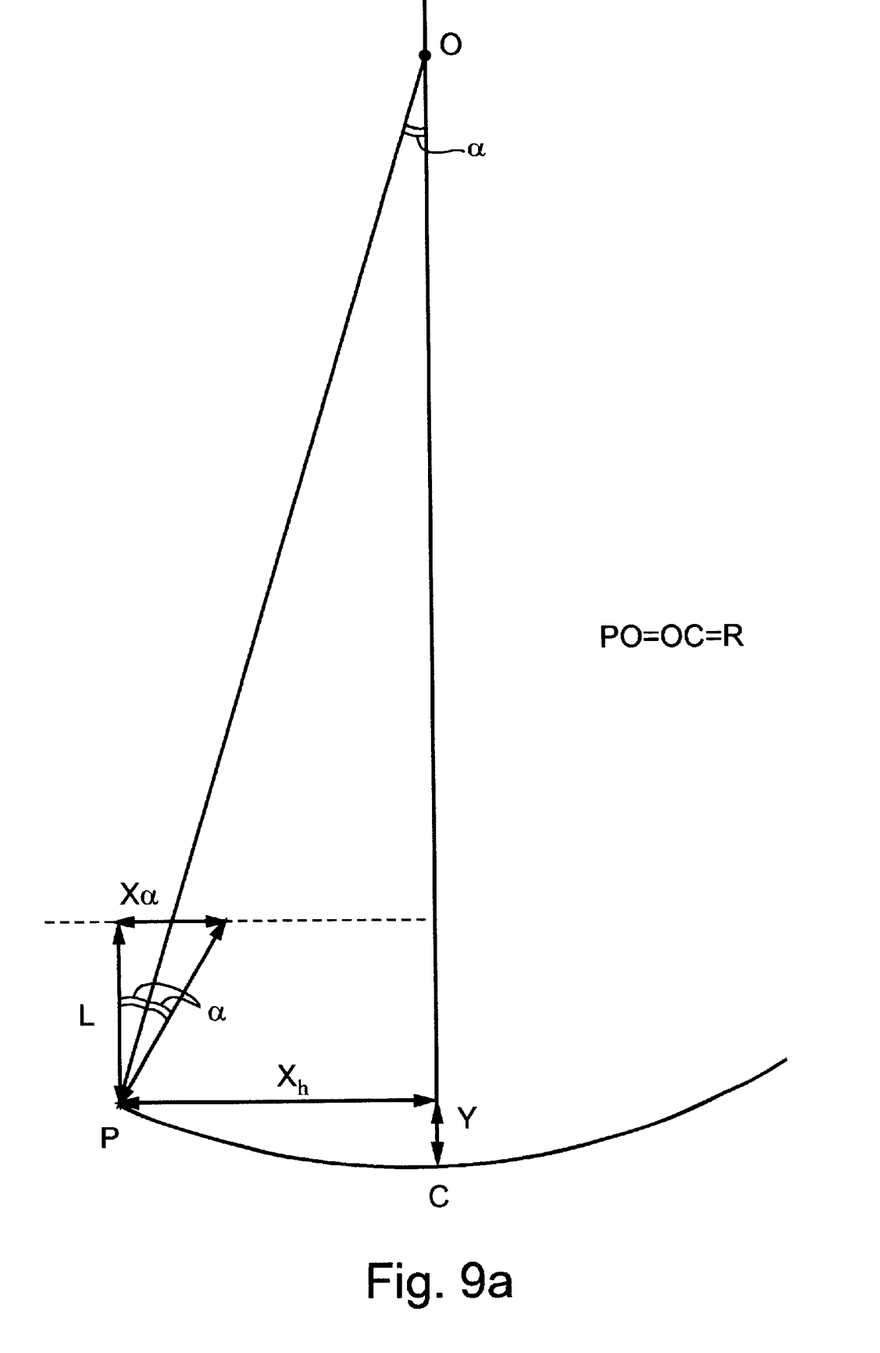

The wafer is irradiated from each of the optical heads such that each beam follows substantially an identical optical path length except for a difference, denoted Y, due to bowing in the wafer. Provided that Y is smaller than the wavelength of the light then measurement of the phase difference between the beams may yield Y, from which the radius of curvature in the wafer can be calculated. Reference is now made to FIG. 9A which is a ray diagram illustrating calculation of a radius of curvature. A formal geometric scheme for derivation of the value R is shown in FIG. 9a, as follows:

$$R = \frac{2LXh}{X\alpha},$$

Where
L=length of beam path,
Xh=distance between the central and peripheral points of the measurement.
X$\alpha$=shift of the reflected beam from stressed wafer.

As shown in FIG. 9a, the radius of curvature R can be calculated by formula:

$$R = \frac{Y^2 + Xh^2}{2Y},$$

Where
Y=distance of the wafer carving in central point of the measurement
Xh=distance between the central and peripheral points of the measurement.

Returning now to FIG. 8, and a processor 70 is connected to the optical processor 58, to calculate the radius of curvature and thus the stress on the wafer. The optical processor 58 is preferably an interferometer. When the reflected beams reach the interferometer an interference fringe pattern is set up. The fringe pattern preferably gives the phase difference between the beams, from which the distance can be derived. The interferometer is preferably a Michelson interferometer.

Preferably, the same optical heads, 62, and 64, which direct the light as beams towards the wafer, serve to receive the reflections and direct them to the optical processors, as will be explained in more detail below.

In one embodiment, both of the optical heads 62 and 64 send out parallel beams. It will be noted that FIG. 9, which shows the peripheral beam being reflected along the same path as the incident beam, is somewhat simplified as the angle of incidence on the bowed part of the wafer surface is not ninety degrees. Thus, in measuring the phase difference, it is necessary to take into account the additional path length which is due solely to the angle of reflection. Of course, it will be appreciated that the angle of reflection is not known until the bow has been calculated and thus, for accurate results a calculation which involves a number of iterations may be required.

Figure 10:
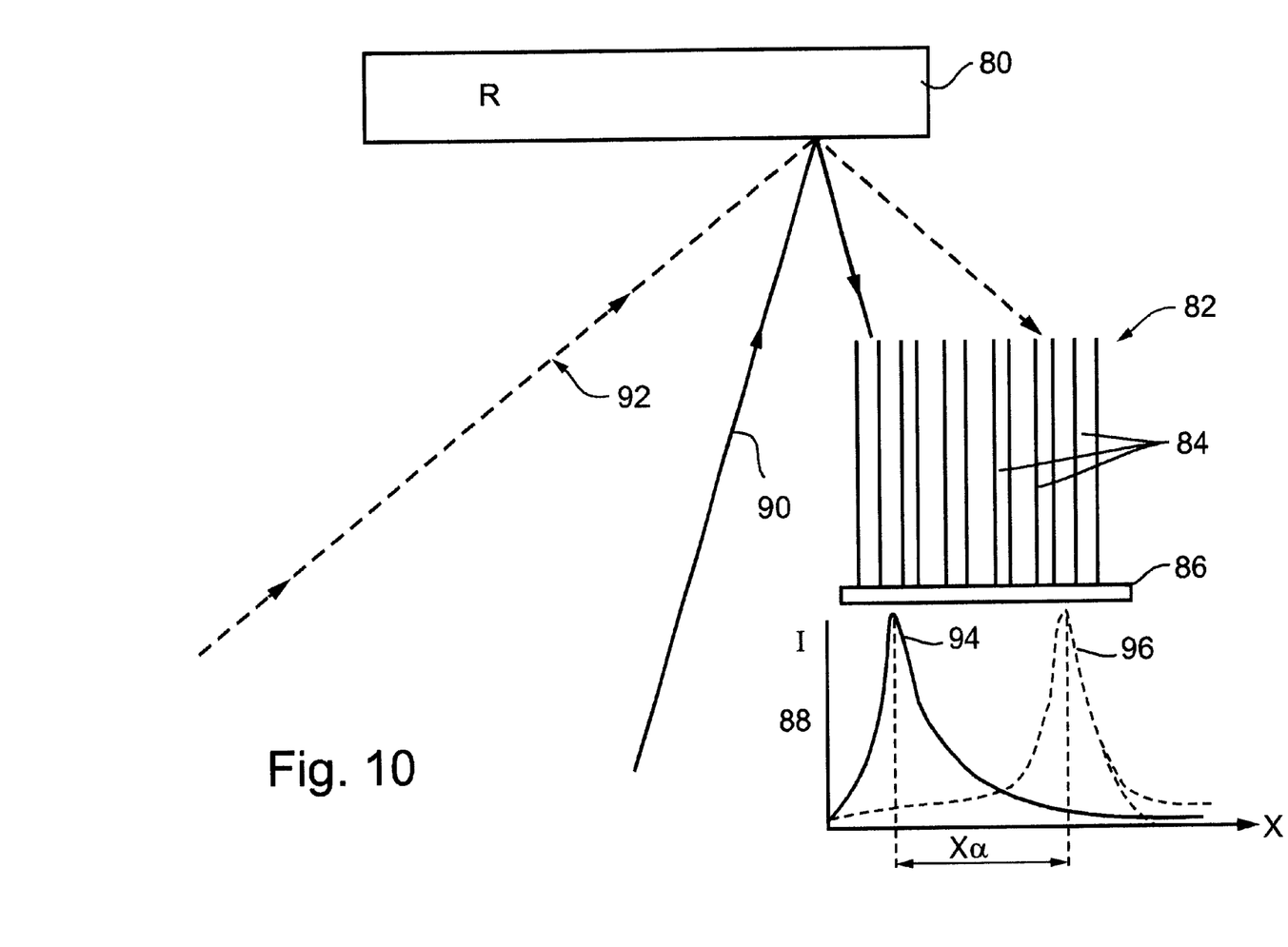
FIG. 10 is a simplified schematic diagram showing apparatus for measurement of bow according to another embodiment of the present invention.

Reference is now made to FIG. 10, which is a simplified schematic diagram showing a further embodiment of the present invention. In the embodiment of FIG. 10, the inaccuracies due to the angle of reflection are taken into account. In FIG. 10, there is shown schematically a beam reflector 80 which reflects light received from the wafer 54. The light is reflected onto a detector 82 which comprises an array of waveguides 84 each connected to light intensity measurement units arranged to correspond to the waveguides. The measurement units are preferably arranged in a block 86.

In use, the angle that a light beam is incident on the reflector 80 determines which of the light guides it is principally directed to. An intensity graph can be drawn, (88 in FIG. 10) and the bowing angle in the wafer can be derived from the position of a peak in the intensity graph.

In FIG. 10, two beams 90 and 92 are shown for comparison. Beam 90 produces first peak 94 in graph 88 and second beam 92 produces a second peak 96.

FIG. 10 shows reflector 80 as a planar reflector. However, in a preferred embodiment a parabolic reflector is used, and more particularly an off-axis parabolic reflector or mirror.

Returning now to the processor 70, the processor 70 is able to determine a stress level in the wafer from the bow using the relationship $$\text{stress} = \frac{ED^2}{6(1-v)tR},$$

wherein
E=Young's modulus of the wafer,
v=Poisson's ratio for the wafer,
$D_s$=thickness of the wafer,
R net radius of curvature, derivable from the extent of bowing, as described above, and
$D_f$=thickness of the film deposited on the wafer, which is responsible for the stress.

Returning again to FIG. 8, and now considering the thickness measuring part of the apparatus, there is additionally provided a white light source 100, and also an optical switch 102 for switching between the laser 52 and the white light source 100 so that light from either source can be directed at the wafer as desired.

As part of the thickness measurement part there is provided a second optical processor 104 for processing reflections from the wafer to determine thicknesses of transparent and semi-transparent layers on the wafer, as explained above. The second optical processor 104 preferably comprises a spectrometer for obtaining a spectrum of the reflected light which may subsequently be transformed into the frequency domain for analysis to determine what layers are present, as described above.

Additionally, there is provided a second optical switch 106 for switching reflected light between the two optical processors.

Preferably, control is provided over the switches 102 and 106 to ensure that the laser source 52 is used with the first optical processor and the white light source is used with the second optical processor 104.

The second optical processor 104 is preferably connected to an electronic processor 108 to transform the spectrum produced by the second optical processor 104 into the frequency domain, typically using a Fourier transform. The transform is used to obtain thickness layer information as described above.

It is appreciated that the stress calculation processor 70 and the thickness calculation processor 108 may be implemented on a single processing chip. Typically, the calculations are carried out by a PC connected to the apparatus.

Figure 11:
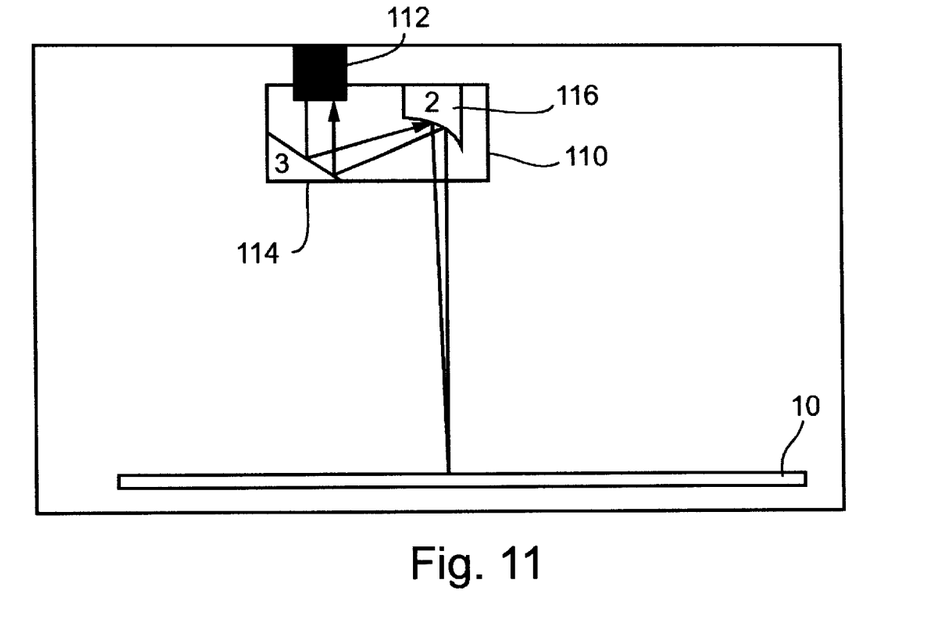
FIG. 11 is a simplified schematic representation of an optical head for use in embodiments of the present invention.

Reference is now made to FIG. 11, which is a simplified diagram showing an optical head for use in connection with the above embodiments. Parts that are the same as in previous figures are, as far as practicable, given the same reference numerals and are described further only to the extent necessary for an understanding of the present embodiment. Optical head 110 receives an incoming beam from one of the light sources via light guide 112. The light is reflected via angled plain mirror 114 to off-axis parabolic mirror 116 from which it is directed as a parallel beam to the surface of wafer 10. A reflection wave travels the reverse path through the optical head to the same waveguide 112.

Figure 12:
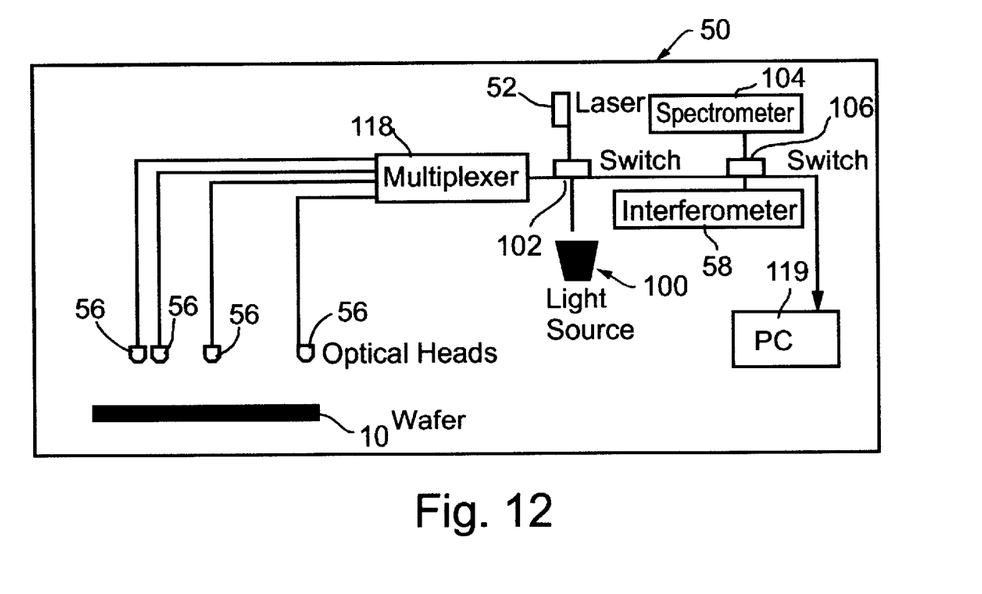
FIG. 12 is a simplified block diagram of measurement apparatus according to an embodiment of the present invention.

Reference is now made to FIG. 12, which is a simplified block diagram of an overall device for providing integrated measurement of a wafer 10. FIG. 12 is a more detailed version of FIG. 8 and parts appearing in the earlier figure are given the same reference numerals and will not be discussed further except as necessary. In FIG. 12 the optical head arrangement of FIG. 8 is explicitly shown as a plurality of optical heads. The two light sources are shown explicitly as a laser source 52 and a light source 100, and the two optical processors are shown explicitly as a spectrometer 104 and an interferometer 58. In addition, only a single optical fiber arrangement is shown for carrying the outward bound and reflected waves and a multiplexer 118 is used to switch between the optical heads 56. The stress and thickness calculations are preferably carried out on a PC 119 attached to the measurement apparatus.

Figure 13:
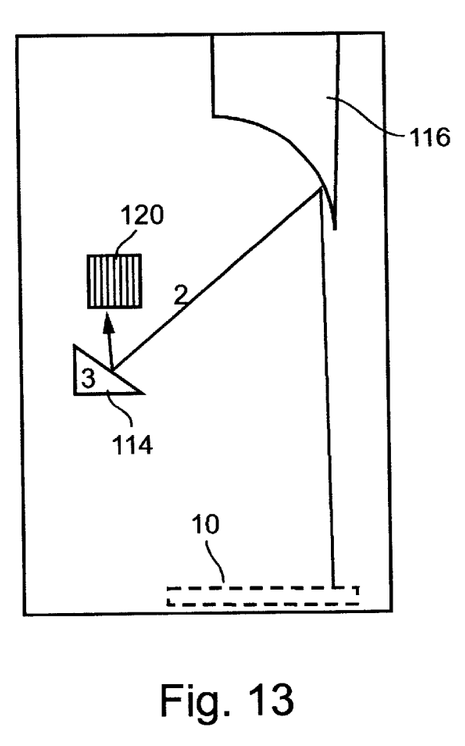
FIG. 13 is a simplified ray diagram showing a reflected beam from a parallel region of a wafer.
Figure 14:
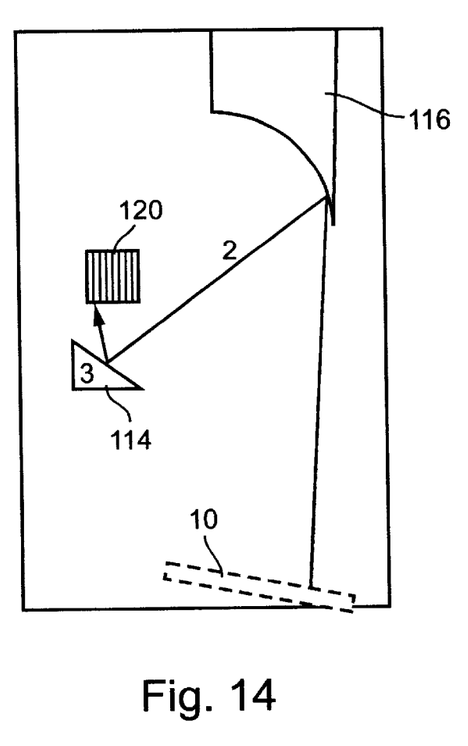
FIG. 14 is a simplified ray diagram showing a reflected beam from a tilted region of a wafer.

Reference is now made to FIGS. 13 and 14, which are simplified diagrams showing the optical head of FIG. 11 adapted for the embodiment of FIG. 10. The optical head is the same as that shown in FIG. 11, except that the reflected signal is sent to an array 120 of wave guides. As discussed in FIG. 11, the wave guide within the array giving maximum output intensity is indicative of the angle of reflection. FIG. 13 shows a reflected beam from a parallel region of the wafer surface, (parallel meaning the central, non-bowed area) and FIG. 14 shows a reflected beam from an angled part of the wafer. In each case, the reflected beam is centered on a different part of the wave guide array 120.

There is thus provided an integrated measuring device which can be used in a wafer production line to test the quality of layer applications in a way that takes up a minimum of space and improves throughput as against the prior art, whilst at the same time allowing for effective testing of product quality.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

What is claimed is:

1. Apparatus for measuring properties of a wafer, the apparatus comprising:
   at least one monochromatic light source, for producing monochromatic light for directing at said wafer,
   at least a first and a second beam director, each optically associated with said monochromatic light source for directing said monochromatic light from said source to provide respective substantially parallel light beams towards said wafer, said beam directors being configured to cause said respective beams to strike at respective places on a planar surface of said wafer, said first beam director being arranged to direct a first of said respective beams substantially centrally onto said planar surface and said second beam director being alignable to direct a second of said respective beams substantially outwardly of said center to a point at a selected distance from said first beam,
   an optical processor arranged to receive reflections of each beam and further comprising an interferometer unit to process said reflections together, thereby to detect any optical difference between said reflections, said optical difference being indicative of bow in said wafer, said bow being usable with said selected distance to calculate a stress within said wafer.

2. Apparatus according to claim 1, further comprising a measurement mode switch for switching between said bow measurement and measurement of another property of said wafer.

3. Apparatus according to claim 1, further comprising an output operatively associated with said optical processor for outputting an indication of said calculated stress, said indication being based on said bow.

4. Apparatus according to claim 1, said beam directors comprising optical heads for receiving light from said monochromatic light source and directing said light as beams to said wafer.

5. Apparatus according to claim 4, said optical heads further being operable to receive said reflections from said wafer and to direct said reflections to said optical processor.

6. Apparatus according to claim 1, at least said first beam director being arranged to direct light to strike said planar surface substantially perpendicularly.

7. Apparatus according to claim 1, at least said second beam director being alignable to direct said respective beam to strike said planar surface substantially obliquely.

8. Apparatus according to claim 1, said optical processor and said interferometer being associated with a calculation unit for said calculating said stress within said wafer using said bow and said selected distance.

9. Apparatus according to claim g 1 said interferometer being operable to produce an interference pattern between said respective beams, said optical difference being a path difference between said beams.

10. Apparatus according to claim 9, said interferometer being a Michelson interferometer.

11. Apparatus according to claim 1, said optical processor comprising a beam reflector and a plurality of waveguides, said beam reflector being arranged to deflect reflections from said planar surface to said waveguides such that intensity of said deflection is differentially distributed between said waveguides as a function of an angle of said reflection.

12. Apparatus according to claim 11, wherein said optical processor further comprises an intensity measurer for measuring light intensity in each of said waveguides, said optical difference being a difference in distribution of intensity over said waveguides.

13. Apparatus according to claim 11, said optical beam reflector being an off axis parabolic reflector.

14. Apparatus according to claim 1, said monochromatic light source comprising a laser.

15. Apparatus according to claim 8, wherein said calculating unit comprises a stress determination unit operable to determine a stress level from said bow using the relationship $$\text{stress} = \frac{ED^2}{6(1-v)tR},$$

wherein
   E=Young's modulus of the wafer,
   v=Poisson's ratio for the wafer,
   $D_s$=thickness of the wafer,
   R=net radius of curvature, derivable from said bow, and
   $D_f$=thickness of a film deposited on said wafer.

16. Apparatus according to claim 1, said another property being thickness, said apparatus further comprising a white light source, each said beam director comprising a first optical switch to select between said white light source and said monochromatic source.

17. Apparatus according to claim 16, further comprising a second optical processor and at least one second optical switch, said second optical switch being arranged to select between said first optical processor and said second optical processor to direct said reflections to said selected optical processor.

18. Apparatus according to claim 17, said second optical processor comprising a spectrometer.

19. Apparatus according to claim 17, said first and second optical switches being controllable together to select said monochromatic light source with said first optical processor and said white light source with said second optical processor.

20. Apparatus according to claim 19, further comprising a Fourier transform device connected to said spectrometer for transforming an output of said spectrometer into the frequency domain, thereby to obtain information of layer thickness of at least one deposited layer on said wafer.

21. Integrated measurement apparatus for measuring layer thickness and bow in a wafer, the apparatus comprising:
   a monochromatic light source,
   a white light source,
   a first switch for switching between said white light source and said monochromatic light source,
   a plurality of beam directors for directing light from said switched light source onto a semiconductor wafer,
   a first optical processor for spectral processing of reflected light from said wafer,
   a second optical processor for processing of reflected light to determine an extent of bow in said wafer, and
   a second optical switch to switch reflected light from said wafer between said first optical processor and said second optical processor.

22. Integrated measurement apparatus according to claim 21, wherein said first optical processor is a spectrometer and said second optical processor is an interferometer.

23. Integrated measurement apparatus according to claim 21, wherein said first optical processor is a spectrometer and said second optical processor comprises
   a reflector, for deflecting reflected light from said wafer,
   a series of waveguides arranged to intercept said deflected light, in such a way that different angles of reflection of said light from said wafer are indicated by different waveguides respectively giving maximum light intensity,
   light intensity detectors associated with each waveguide to detect light intensity at each waveguide, thereby to determine which waveguide has a maximum intensity, and therefrom to derive the angle of reflection from said wafer.

24. Integrated measurement apparatus according to claim 21, further comprising a stress calculator operatively associated with said second optical processor for calculating an indication of stress in said wafer, said indication being based on said bow.

25. Integrated measurement apparatus according to claim 21, wherein said light directors comprise optical heads operable to receive said reflections from said wafer and to direct said reflections to said second optical switch.

26. Integrated measurement apparatus according to claim 22, said interferometer being a Michelson interferometer.

27. Integrated measurement apparatus according to claim 23, said optical beam reflector being a parabolic reflector.

28. Integrated measurement apparatus according to claim 21, said monochromatic light source comprising a laser.

29. Integrated measurement apparatus according to claim 21, further comprising a stress determination unit operable to determine a stress level from said bow using the relationship $$\text{stress} = \frac{ED^2}{6(1-v)tR},$$

wherein
   E=Young's modulus of the wafer,
   v=Poisson's ratio for the wafer,
   $D_s$=thickness of the wafer,
   R=net radius of curvature, derivable from said bow, and
   $D_f$=thickness of a film deposited on said wafer.

30. Integrated measurement apparatus according to claim 22, further comprising a Fourier transform device connected to said spectrometer for transforming an output of said spectrometer into the frequency domain, thereby to obtain information of layer thickness of at least one deposited layer on said wafer.

31. Integrated measurement apparatus according to claim 23, further comprising a Fourier transform device connected to said spectrometer for transforming an output of said spectrometer into the frequency domain, thereby to obtain information of layer thickness of at least one deposited layer on said wafer.

32. A method of measuring stress in a silicon wafer, using an integrated measurement apparatus, the method comprising:
   switching in a monochromatic light source to produce at least two monochromatic light beams,
   reflecting said at least two beams of light from a surface of a wafer, a first beam from a central region of said wafer and a second beam from a peripheral region of said wafer,
   determining properties of said reflected beams,
   comparing said determined properties of said reflected light beams to thereby determine an extent of bowing in said wafer, and
   calculating a stress level in said wafer from said extent of bowing.

33. A method according to claim 32, wherein said properties are path lengths of said reflected beams.

34. A method according to claim 33, wherein said determination and comparison comprise:
   setting up an interference pattern between said reflections, and
   analyzing said interference pattern.

35. A method according to claim 32, wherein said determination and comparison comprise measuring and comparing respective angles of reflection of said beams.

36. A method according to claim 32, comprising determining said stress level from said extent of bowing using the relationship $$\text{stress} = \frac{ED^2}{6(1-v)tR},$$

wherein
   E=Young's modulus of the wafer,
   v=Poisson's ratio for the wafer,
   $D_s$=thickness of the wafer,
   R=net radius of curvature, derivable from said bow, and
   t=thickness of a film deposited on said wafer.

37. A method according to claim 32, said light beams being laser light beams.

38. A method according to claim 37, said monochromatic light source being a laser light source.

39. A method according to claim 34, comprising carrying out said determination and comparison using a Michelson interferometer.

40. An method of integrated measurement of stress and thickness in a semiconductor wafer, the method comprising:
   selecting between a white light source and a monochromatic light source,
   with the white light source:
      irradiating a semiconductor at a single point,
      receiving reflected light from said single point,
      spectrally analyzing said reflected light using a transform,
      deriving layer thickness from said analysis, with the monochromatic source:
reflecting at least two beams of light from a surface of a wafer, a first beam from a central region of said wafer and a second beam from a peripheral region of said wafer,
determining properties of said reflected beams,
comparing said determined properties of said reflected light beams to thereby determine an extent of bowing in said wafer, and
calculating a stress level in said wafer from said extent of bowing.

41. A method according to claim 40, wherein said properties are path lengths of said reflected beams.

42. A method according to claim 41, wherein said determination and comparison comprise:

setting up an interference pattern between said reflections, and analyzing said interference pattern.

43. A method according to claim 40, wherein said determination and comparison comprise measuring and comparing respective angles of reflection of said beams.

44. A method according to claim 40, comprising determining said stress level from said extent of bowing using the relationship $$\text{stress} = \frac{ED^2}{6(1-v)tR},$$

wherein
 E=Young's modulus of the wafer,
 v=Poisson's ratio for the wafer,
 $D_s$=thickness of the wafer,
 R=net radius of curvature, derivable from said bow, and
 t=thickness of a film deposited on said wafer.

45. A method according to claim 40, further comprising obtaining said monochromatic light beams from a laser light source.

46. A method according to claim 42, comprising carrying out said determination and comparison using a Michelson interferometer.

47. A method according to claim 40, further comprising optically switching between said white and said monochromatic light sources.

48. A method according to claim 40, comprising optically switching between a spectrometer and an interferometer.

49. A method according to claim 48, further comprising controlling said optical switching so that said spectrometer is selected with said white light source and said interferometer is selected with said monochromatic light source.

50. A method according to claim 49, comprising switching light from either light source to an integrated beam former arrangement for irradiating said wafer.

51. A method according to claim 50, wherein said integrated beam forming arrangement comprises a plurality of optical heads also usable to receive reflections from said wafer.

* * * * *